(12) United States Patent
Yu

(10) Patent No.: US 11,789,425 B2
(45) Date of Patent: Oct. 17, 2023

(54) TRANSPORT CONTROL APPARATUS AND TRANSPORT CONTROL SYSTEM INCLUDING THE SAME

(71) Applicant: SEMES CO., LTD., Chungcheongnam-do (KR)

(72) Inventor: Su Jong Yu, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 501 days.

(21) Appl. No.: 16/916,341

(22) Filed: Jun. 30, 2020

(65) Prior Publication Data

US 2021/0003988 A1 Jan. 7, 2021

(30) Foreign Application Priority Data

Jul. 5, 2019 (KR) .................... 10-2019-0081606

(51) Int. Cl.
*G05B 19/402* (2006.01)
*H01L 21/677* (2006.01)
(Continued)

(52) U.S. Cl.
CPC ......... *G05B 19/402* (2013.01); *B65G 1/0457* (2013.01); *G05B 19/4189* (2013.01);
(Continued)

(58) Field of Classification Search
CPC .............. G05B 19/402; G05B 19/4189; G05B 19/41865; G05B 2219/45031;
(Continued)

(56) References Cited

U.S. PATENT DOCUMENTS 5,339,952 A 8/1994 Hecht et al.
7,305,287 B2 12/2007 Park
(Continued)

FOREIGN PATENT DOCUMENTS

CN 109110361 A 1/2019
CN 109649974 A 4/2019
(Continued)

OTHER PUBLICATIONS

Japanese Notice of Reasons for Refusal for Japanese Application No. 2020-108643, dated Aug. 9, 2022 with translation, 9 pages.
(Continued)

*Primary Examiner* — Glenn F Myers
(74) *Attorney, Agent, or Firm* — RatnerPrestia

(57) ABSTRACT

There is provided a transport control system assigning multiple jobs to an overhead hoist transport (OHT) based on the availability of linkage transporting and the likelihood of transport congestion. The transport control system includes: a plurality of transports, each of the plurality of transports transporting a carrier with a wafer loaded thereon; and a transport control apparatus controlling the plurality of transports and determining one of the plurality of transports as a target transport to which multiple jobs are to be assigned. The transport control apparatus determines one of the plurality of transports as the target transport based on a first element, which is the availability of linkage transporting, and a second element, which is the likelihood of transport congestion.

20 Claims, 14 Drawing Sheets

(51) Int. Cl.
*B65G 1/04* (2006.01)
*H01L 21/67* (2006.01)
*G05B 19/418* (2006.01)

(52) U.S. Cl.
CPC .... *H01L 21/6773* (2013.01); *H01L 21/67276* (2013.01); *H01L 21/67733* (2013.01); *B65G 2201/0297* (2013.01); *G05B 2219/45031* (2013.01)

(58) Field of Classification Search
CPC ........... G05B 2219/32258; G05B 2219/32328; G05B 2219/32365; G05B 2219/39167; B65G 1/0457; B65G 2201/0296
USPC .................................................. 700/100, 99
See application file for complete search history.

(56) References Cited

U.S. PATENT DOCUMENTS

| | | |
|---|---|---|
| 7,434,676 B2 | 10/2008 | Brill et al. |
| 9,934,993 B2 | 4/2018 | Kinugawa et al. |
| 9,991,143 B2 | 6/2018 | Takai |
| 10,354,902 B2 | 7/2019 | Honda et al. |
| 10,479,613 B2 | 11/2019 | Harasaki |
| 10,604,351 B2 | 3/2020 | Takahara et al. |
| 10,699,925 B2 | 6/2020 | Ogawa et al. |
| 2004/0171269 A1 | 9/2004 | Kondo et al. |
| 2009/0067959 A1 | 3/2009 | Takahashi et al. |
| 2015/0300960 A1 | 10/2015 | Morikawa et al. |
| 2017/0008700 A1* | 1/2017 | Wada ................ H01L 21/67727 |
| 2018/0350646 A1* | 12/2018 | Honda .............. H01L 21/67754 |
| 2019/0115234 A1 | 4/2019 | Ogawa et al. |
| 2019/0115238 A1 | 4/2019 | Hofmeister et al. |

FOREIGN PATENT DOCUMENTS

| | | |
|---|---|---|
| JP | 02024706 A | 1/1990 |
| JP | 11175153 A | 7/1999 |
| JP | 2002196822 A | 7/2002 |
| JP | 2005122677 A | 5/2005 |
| JP | 6206748 B2 | 10/2017 |
| KR | 20060043281 A | 5/2006 |
| KR | 20170094502 A | 8/2017 |
| KR | 20180010764 A | 1/2018 |
| KR | 20180092875 A | 8/2018 |
| KR | 20190001553 A | 1/2019 |
| KR | 1020190041417 A | 4/2019 |
| WO | 2007099976 A1 | 9/2007 |
| WO | 2015194267 A1 | 12/2015 |
| WO | 2017090334 A1 | 6/2017 |
| WO | 2017098804 A1 | 6/2017 |

OTHER PUBLICATIONS

Korean Office Action issued in Korean Patent Application No. 19-2019-0081606, dated Nov. 9, 2020, 5 pages.
Korean Grant of Patent issued in Korean Patent Application No. 10-2019-0081606, dated Sep. 1, 2021, with translation, 3 pages.
Korean Notification of Reason for Refusal issued in Korean Application No. 10-2019-0081606, dated May 20, 2021 with translation, 10 pages.
Taiwan Office Action for Taiwan Application No. 109120429, dated Apr. 8, 2022, 8 pages.

* cited by examiner

[FIG. 1]
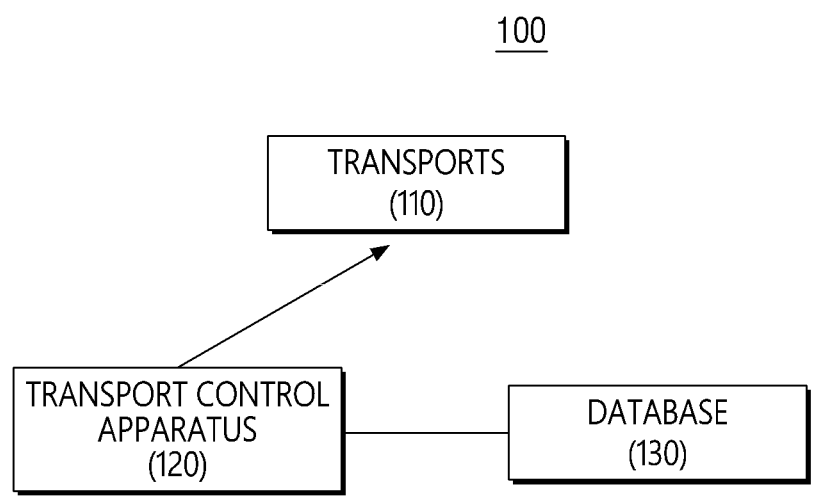

[FIG. 2]
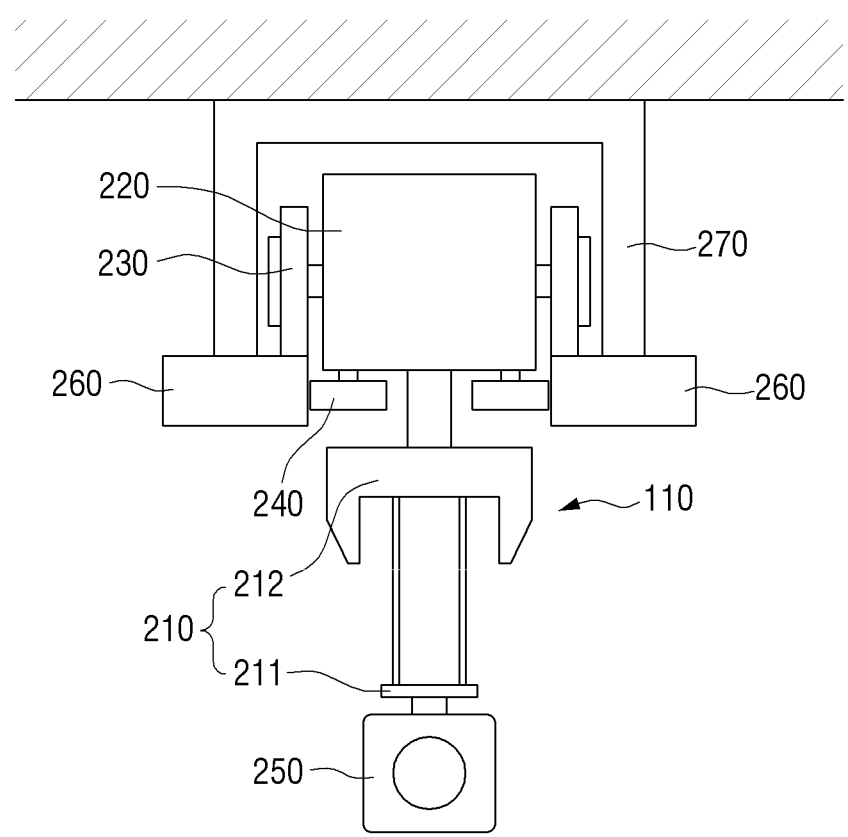

[FIG. 3]
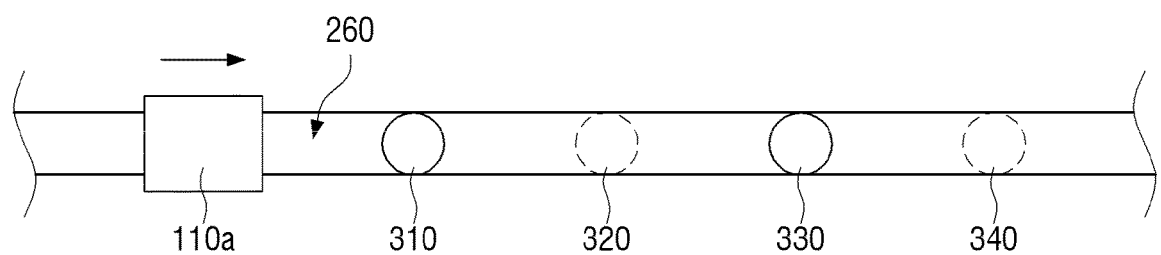

[FIG. 4]
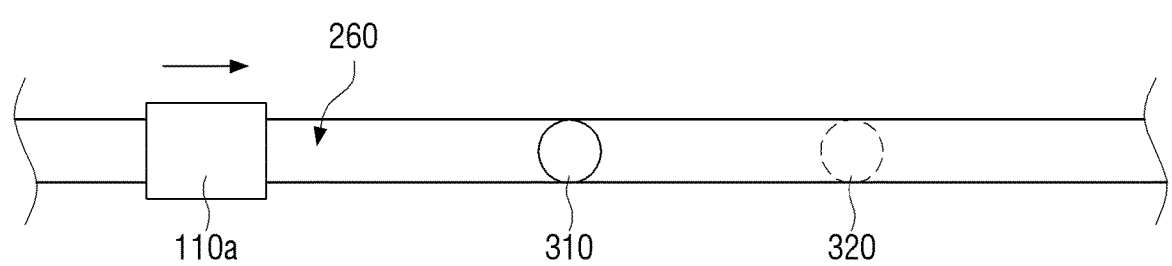
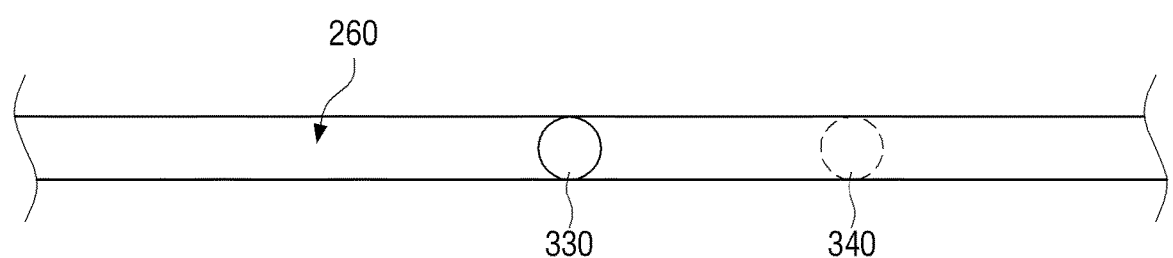

[FIG. 5]
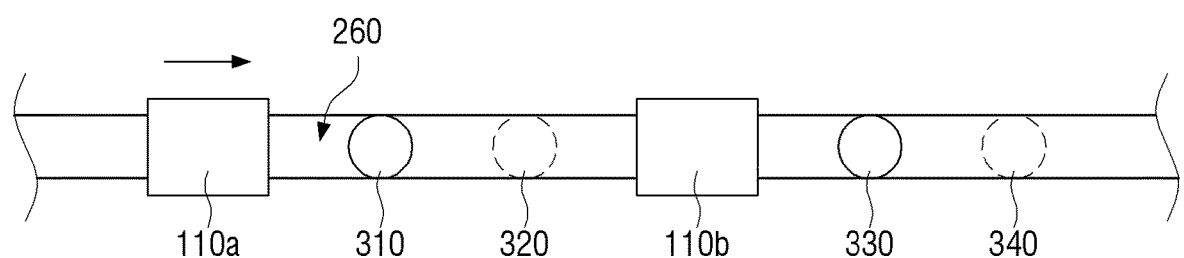

[FIG. 6]
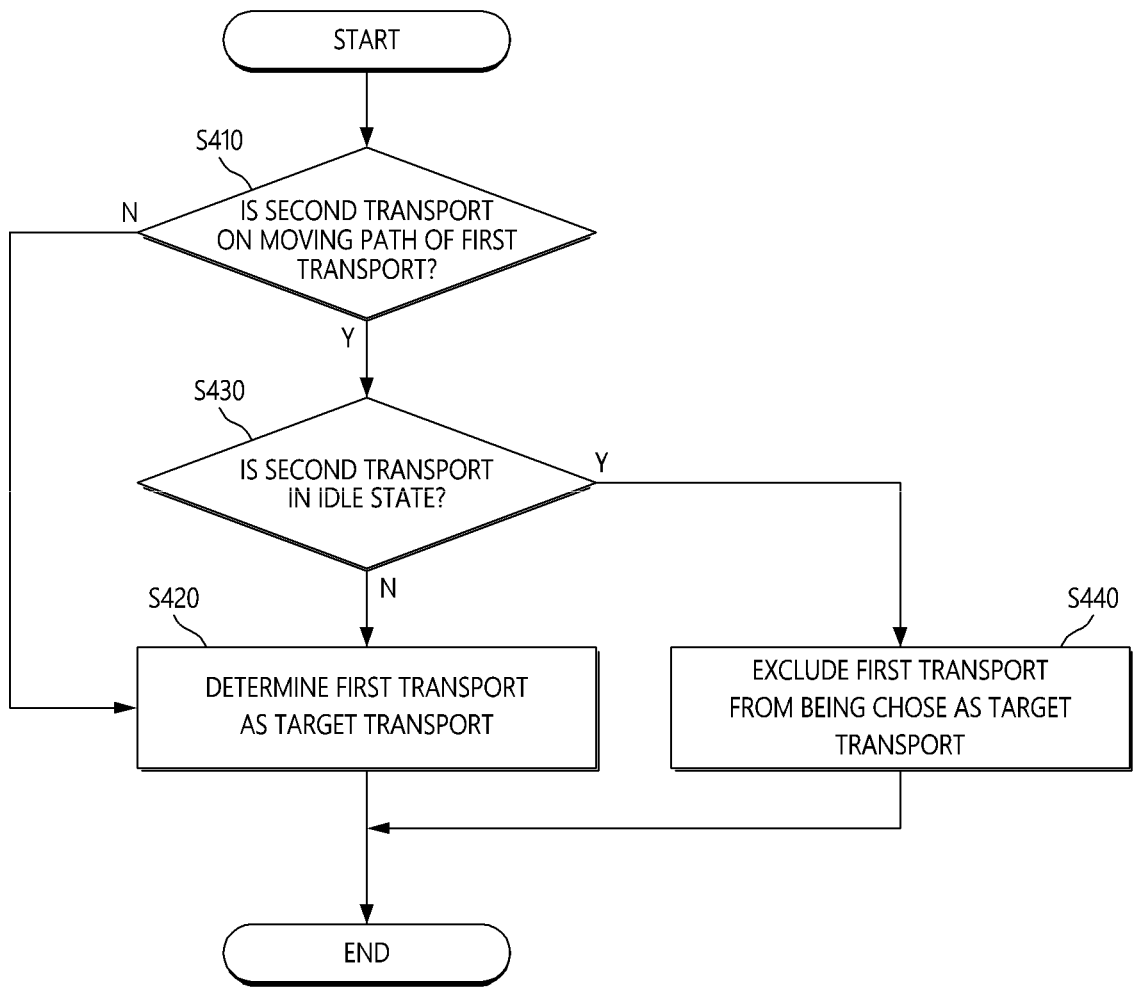

[FIG. 9]
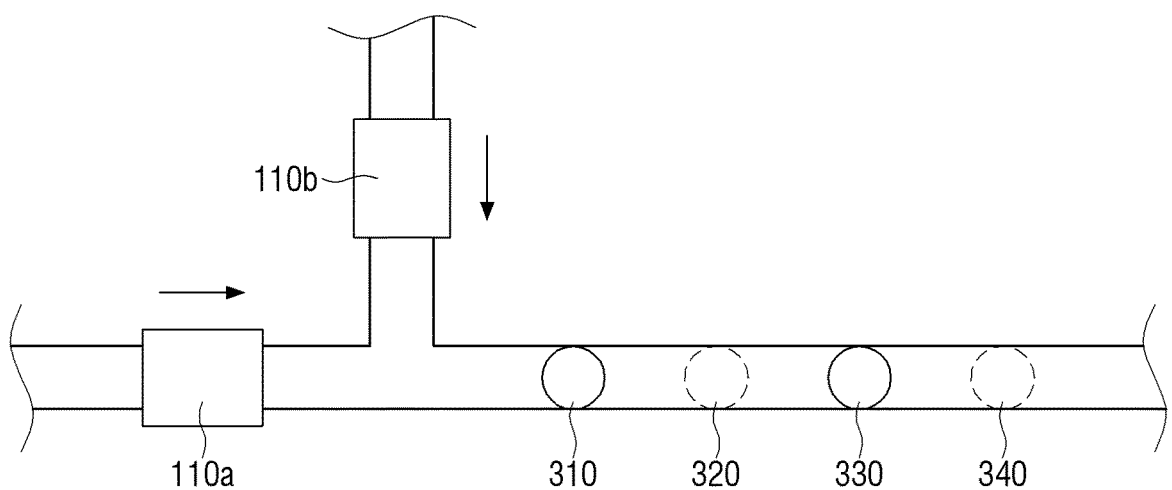

[FIG. 10]
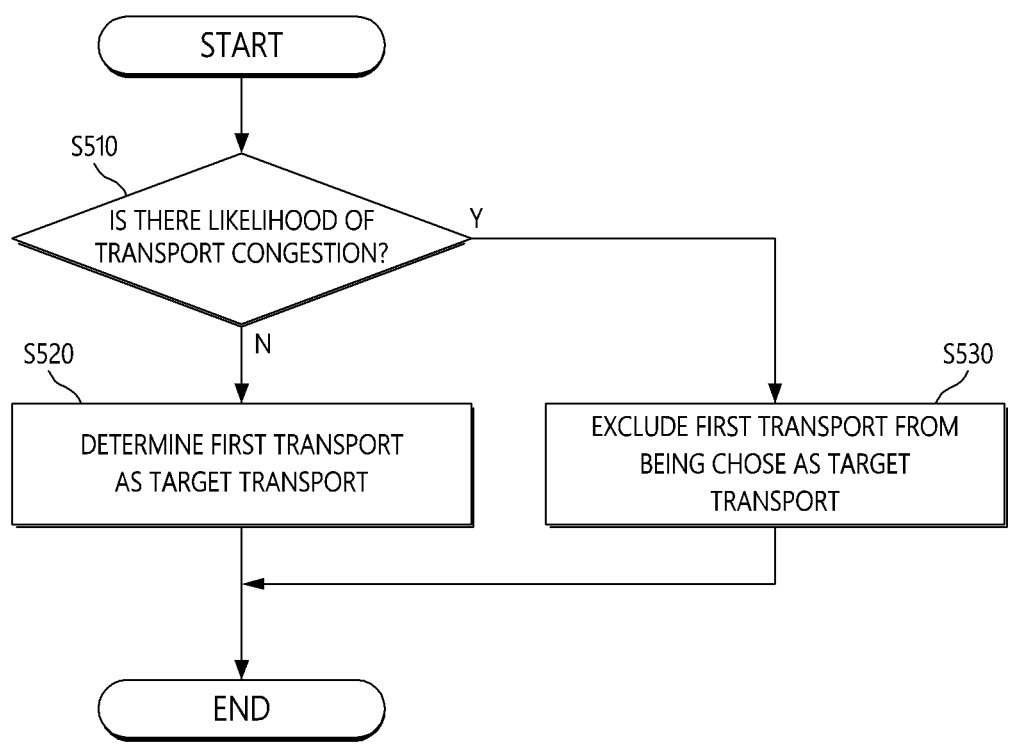

[FIG. 11]
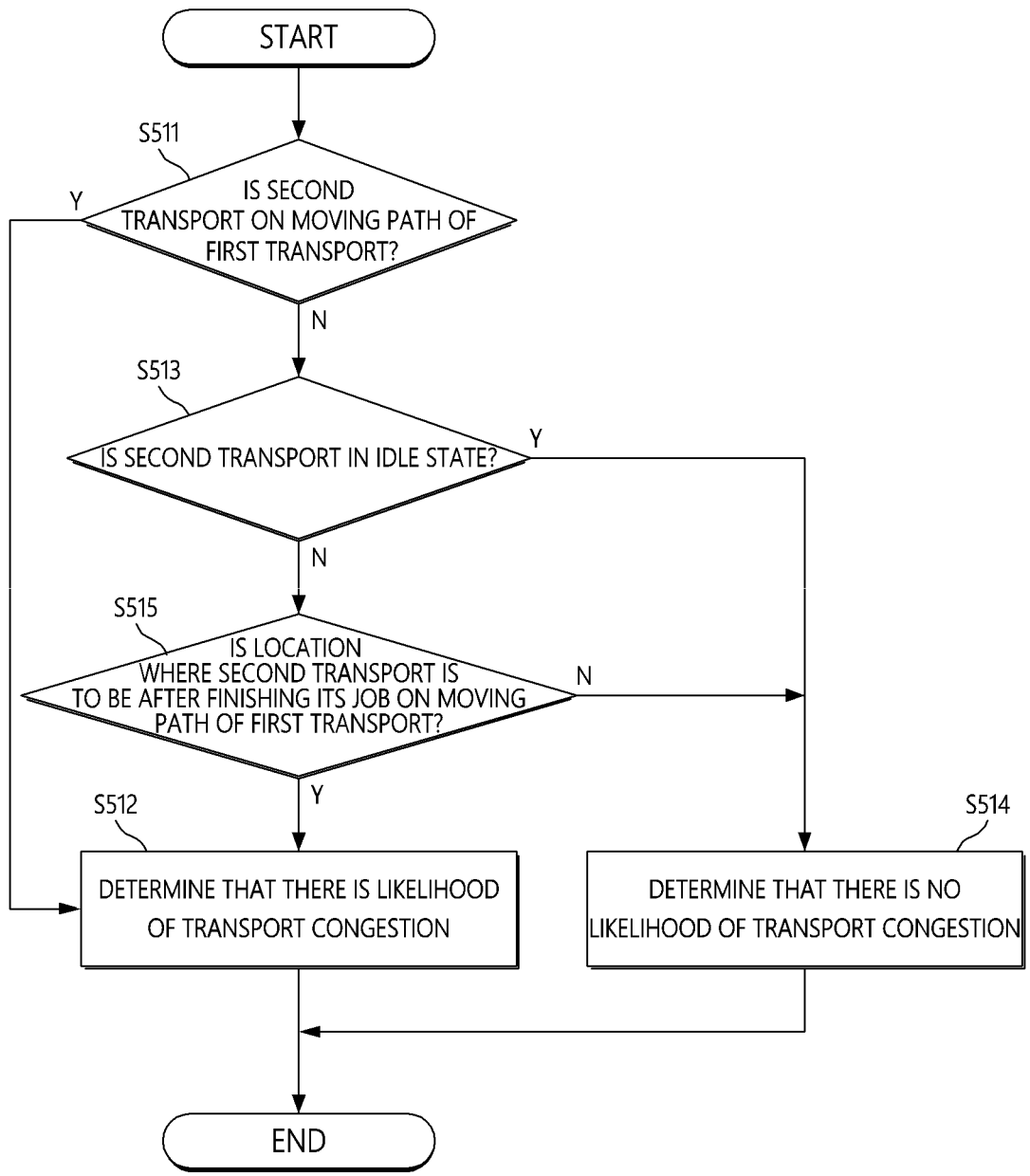

[FIG. 12]
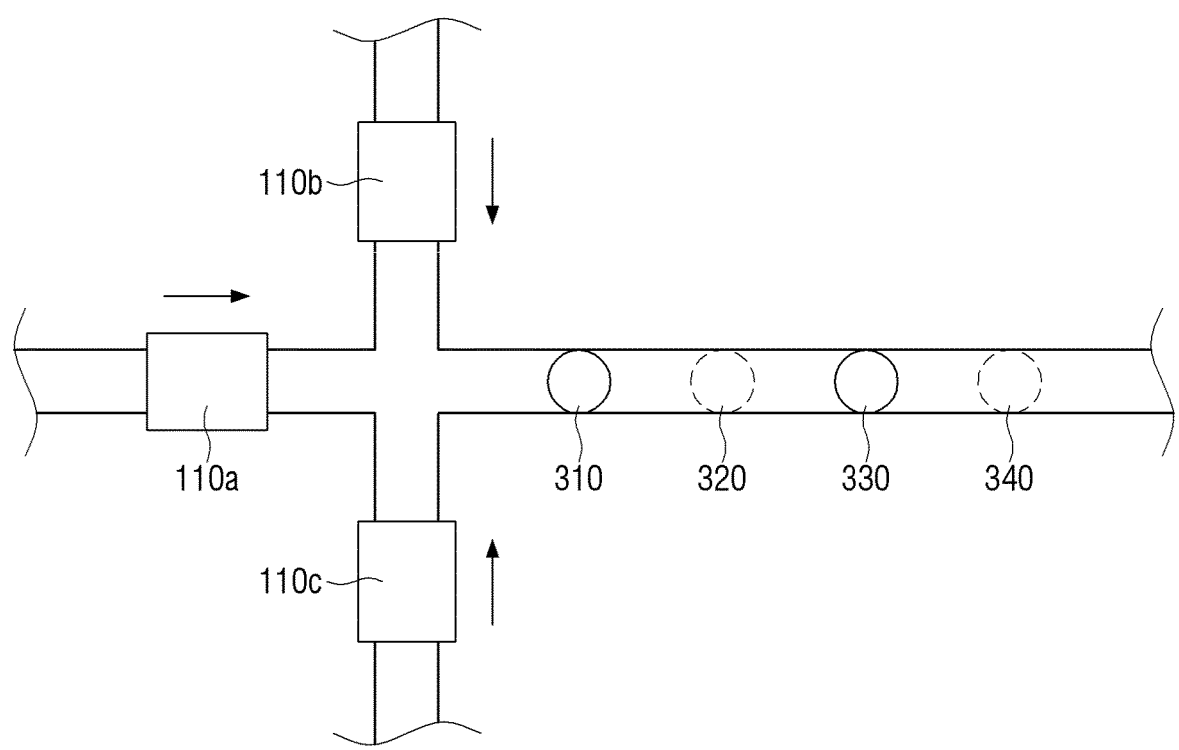

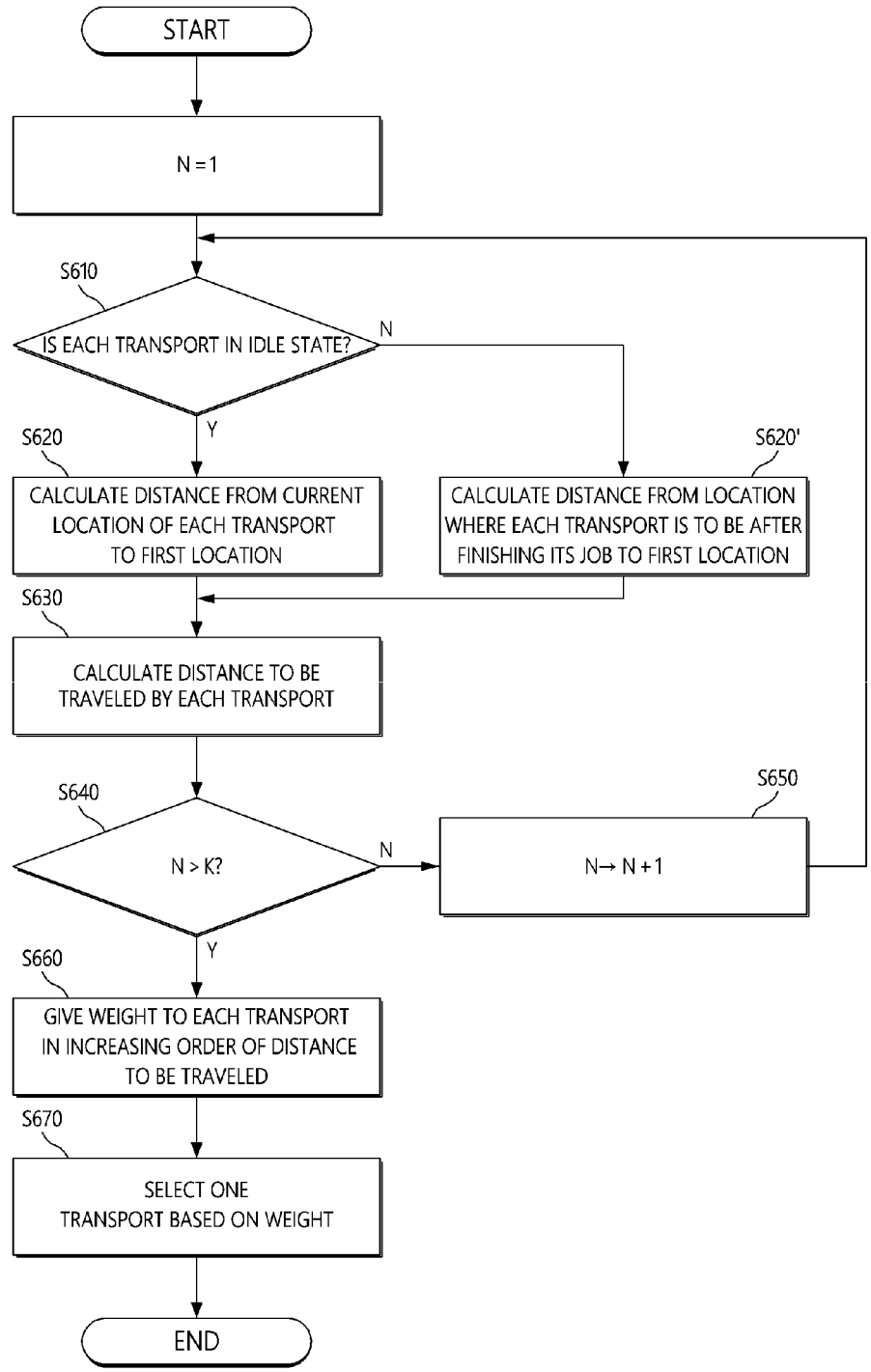
[FIG. 13]

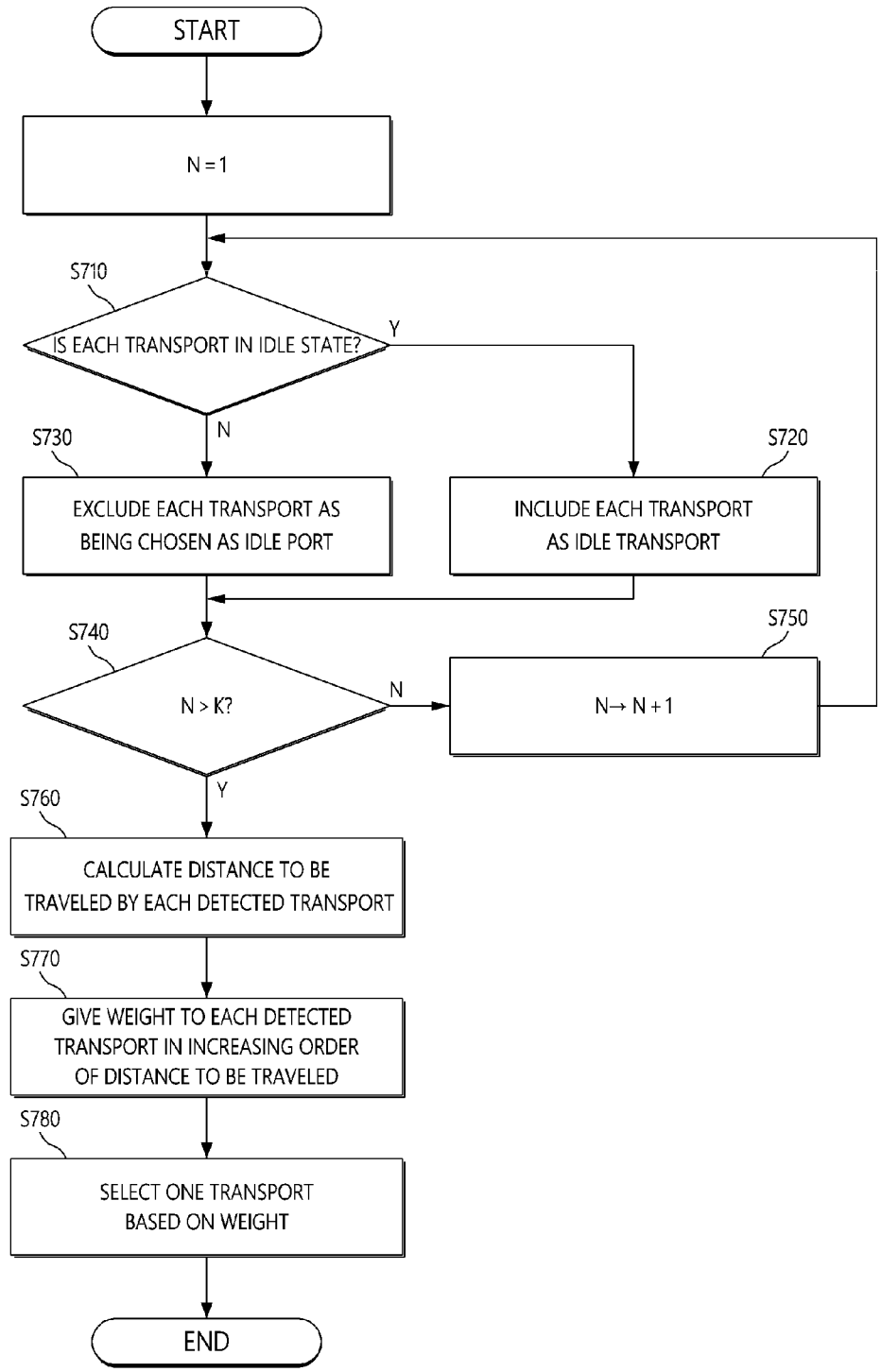
[FIG. 14]

TRANSPORT CONTROL APPARATUS AND TRANSPORT CONTROL SYSTEM INCLUDING THE SAME

CROSS REFERENCE TO RELATED APPLICATION

This application claims priority to Korean Patent Application No. 10-2019-0081606, filed on Jul. 5, 2019, and all the benefits accruing therefrom under 35 U.S.C. § 119, the disclosure of which is incorporated herein by reference in its entirety.

BACKGROUND

1. Field

The present disclosure relates to a transport control apparatus and a transport control system including the same, and more particularly, to a transport control apparatus for use in the fabrication of a semiconductor element and a transport control system including the transport control apparatus.

2. Description of the Related Art

A wafer can be fabricated through various processes in a clean room equipped with manufacturing lines. The wafer may be loaded on a carrier and may be transported to facilities where the various processes are to be conducted, via an overhead hoist transport (OHT) disposed on the ceiling of the clean room.

When load-and-unload commands are generated in response to the generation of jobs, an OHT control system (OCS) assigns the jobs one-by-one to nearby OHTs in consideration of the states of all OHTs (e.g., the availability and the current locations of all the OHTs).

However, the OCS does not consider post-unloading situations when allocating the jobs to the OHTs. Accordingly, if a particular section is swamped with jobs, the particular section may be congested with OHTs so that the jobs may be delayed due to the congestion.

SUMMARY

Embodiments of the present disclosure provide a transport control system which assigns multiple jobs to a particular overhead hoist transport (OHT) based on the availability of linkage transporting and the likelihood of transport congestion.

Embodiments of the present disclosure also provide a transport control system which assigns multiple jobs to a particular OHT based on the availability of linkage transporting and the likelihood of transport congestion.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an aspect of the present disclosure, a transport control system includes: a plurality of transports, each of the plurality of transports transporting a carrier with a wafer loaded thereon; and a transport control apparatus controlling the plurality of transports and determining one of the plurality of transports as a target transport to which multiple jobs are to be assigned, wherein the transport control apparatus determines one of the plurality of transports as the target transport based on at least one of a first element, which is the availability of linkage transporting, and a second element, which is the likelihood of transport congestion.

If the transport control apparatus determines one of the plurality of transports as the target transport based on the first element, the transport control apparatus may determine one of the plurality of transports as the target transport based on whether the multiple jobs are aligned in series on a single path.

If the transport control apparatus determines one of the plurality of transports as the target transport based on the first element and the second element, the transport control apparatus may determine a first transport, which is one of the plurality of transports that is moving to perform the multiple jobs, as the target transport based on whether there exists a second transport, which is another one of the plurality of transports, on a moving path of the first transport.

The transport control apparatus may determine the first transport as the target transport based on at least one of whether the second transport is in an idle state, whether a location where the second transport is to be after finishing its job is on the first moving path, and whether the second transport can be moved if the second transport is located on the first moving path.

The transport control apparatus may determine first whether the second transport is in an idle state and then whether the location where the second transport is to be after finishing its job is on the first moving path.

If the transport control apparatus determines one of the plurality of transports as the target transport based on the first element, the transport control apparatus may determine a particular transport as the target transport by determining whether the multiple jobs are aligned in series on a traveling path of the particular transport based on traveling paths of the plurality of transports.

If the transport control apparatus determines one of the plurality of transports as the target transport based on the second element, the transport control apparatus may determine the likelihood of transport congestion based on whether there exists, on a moving path of a first transport, which is one of the plurality of transports that is moving to perform the multiple jobs, a second transport, which is another one of the plurality of transports and determines the first transport as the target transport based on the result of the determination of the likelihood of transport congestion.

The transport control apparatus may determine the likelihood of transport congestion in further consideration of at least one of whether the second transport is in an idle state and whether a location where the second transport is to be after finishing its job is on the first moving path.

The transport control apparatus may determine first whether the second transport is in an idle state and then whether the location where the second transport is to be after finishing its job is on the first moving path.

If the transport control apparatus determines one of the plurality of transports as the target transport based on the first element, the transport control apparatus may determine a particular transport as the target transport by determining whether the particular transport can perform the multiple jobs in series, without causing transport congestion, based on traveling paths of the plurality of transports.

The transport control apparatus may give weights to the plurality of transports by calculating a distance to be traveled, from a location where the movement of each of the plurality of transports is stopped to a starting location for performing the multiple jobs, and may determine whether each of the plurality of transports is suitable as the target transport, starting from a transport that is selected first based on the weights.

The transport control apparatus may determine first whether each of the plurality of transports is in an idle state and then calculates the distance to be traveled.

For an idle transport, the transport control apparatus may calculate a distance from a current location of the idle transport to the starting location for performing the multiple jobs as the distance to be traveled. For a non-idle transport, the transport control apparatus may calculate a distance from a location where the non-idle transport is to be after finishing its job to the starting location for performing the multiple jobs as the distance to be traveled.

The transport control apparatus may give a relatively large weight to a transport having a relatively short distance to be traveled.

The transport control apparatus may give weights to the plurality of transports based on whether each of the plurality of transports is in an idle state and may determine whether each of the plurality of transports is suitable as the target transport, starting from a transport that is selected first based on the weights.

If there are at least two idle transports among the plurality of transports, the transport control apparatus may give new weights to the at least two idle transports by calculating a distance to be traveled, from a location where movement of each of the at least two idle transports is stopped to a starting location for performing the multiple jobs, and may determine whether each of the at least two idle transports is suitable as the target transport, starting from an idle transport that is selected first based on the new weights.

The transport control apparatus may give a relatively large weight to an idle transport having a relatively short distance to be traveled.

According to another aspect of the present disclosure, a transport control system includes: a plurality of transports, each of the plurality of transports transporting a carrier with a wafer loaded thereon; and a transport control apparatus controlling the plurality of transports and determining one of the plurality of transports as a target transport to which multiple jobs are to be assigned, wherein the transport control apparatus determines one of the plurality of transports as the target transport based on at least one of a first element, which is the availability of linkage transporting, and a second element, which is the likelihood of transport congestion, if the transport control apparatus determines one of the plurality of transports as the target transport based on the first element, the transport control apparatus determines a particular transport as the target transport by determining whether the multiple jobs are aligned in series on a traveling path of the particular transport based on traveling paths of the plurality of transports, and if the transport control apparatus determines one of the plurality of transports as the target transport based on the second element, the transport control apparatus determines the particular transport as the target transport by determining whether the particular transport can perform the multiple jobs in series, without causing transport congestion, based on the traveling paths of the plurality of transports.

According to another aspect of the present disclosure, a transport control apparatus controls a plurality of transports, each of the plurality of transports transporting a carrier with a wafer loaded thereon, wherein the transport control apparatus determines one of the plurality of transports as the target transport based on at least one of a first element, which is the availability of linkage transporting, and a second element, which is the likelihood of transport congestion.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which:

FIG. 1 is a block diagram of a transport control system according to an embodiment of the present disclosure;

FIG. 2 is a front view illustrating how a transport of FIG. 1 is installed on a rail;

FIG. 3 is a schematic view illustrating an example of how a transport control apparatus of FIG. 1 determines a target transport;

FIG. 4 is a schematic view illustrating another example of how the transport control apparatus of FIG. 1 determines a target transport;

FIG. 5 is a schematic view illustrating another example of how the transport control apparatus of FIG. 1 determines a target transport;

FIG. 6 is a flowchart illustrating a method of determining a target transport according to an embodiment of the present disclosure;

FIG. 9 is a schematic view illustrating another example of how the transport control apparatus of FIG. 1 determines a target transport;

FIG. 10 is a flowchart illustrating a method of determining a target transport according to an embodiment of the present disclosure;

FIG. 11 is a flowchart illustrating a method of determining transport congestion according to an embodiment of the present disclosure;

FIG. 12 is a schematic view illustrating an example of how the transport control apparatus of FIG. 1 selects a transport;

FIG. 13 is a flowchart illustrating a method of selecting a transport according to an embodiment of the present disclosure; and FIG. 14 is a flowchart illustrating a method of selecting a transport according to another embodiment of the present disclosure.

DETAILED DESCRIPTION

Figure 7:
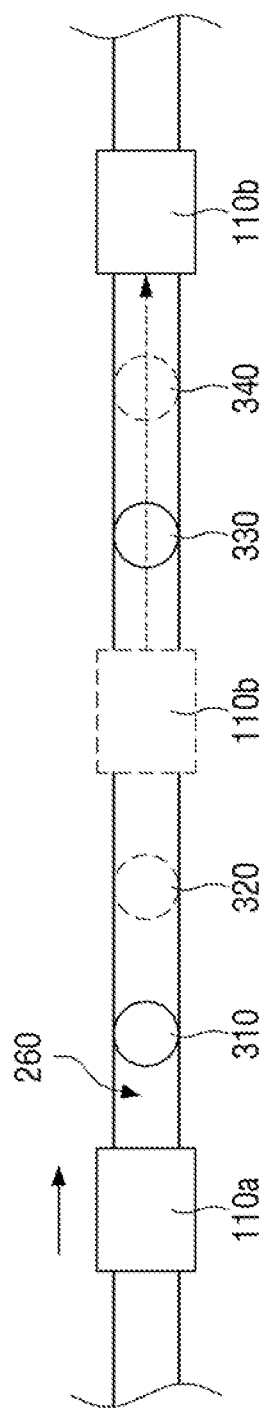
FIG. 7 is a schematic view illustrating another example of how the transport control apparatus of FIG. 1 determines a target transport.

Embodiments of the present disclosure will hereinafter be described with reference to the accompanying drawings. Advantages and features of the invention and methods to achieve the same are described more fully hereinafter with reference to the accompanying drawings in which embodiments are shown. This invention may, however, be embodied in many different forms and should not be construed as limited to the embodiments set forth herein. Rather, these embodiments are provided so that this disclosure is thorough, and will fully convey the scope of the invention to those skilled in the art and this invention is defined by the scope of the claims. Like reference numerals refer to like elements throughout the present disclosure.

It will be understood that when an element or a layer is referred to as being "on" or "above" another element or layer, it can be directly on or above the other element or layer or intervening elements or layers may be present. In contrast, when an element is referred to as being "directly on" or "directly above", there are no intervening elements or layers.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented, and the spatially relative descriptors used herein interpreted accordingly.

It will be understood that, although the terms "first", "second", etc. may be used herein to describe various elements, constituent elements and/or sections, the elements, constituent elements and/or sections should not be limited by these terms. These terms are only used to distinguish one element, constituent element, or section from another element, constituent element, or section. Thus, a first element, a first constituent element, or a first section discussed below should be termed a second element, a second constituent element, or a second section.

The terminology used herein is for the purpose of describing particular embodiments only and is not intended to be limiting of embodiments. As used herein, the singular forms "a", "an", and "the" are intended to include the plural forms as well, unless the context clearly indicates otherwise. It will be further understood that the terms "comprises" and/or "comprising", when used in this specification, specify the likelihood of stated features, steps, operations and/or components do not preclude the presence or addition of one or more features, steps, operations and/or components.

Unless otherwise defined, all terms (including technical and scientific terms) used herein have the same meaning as commonly understood by one of ordinary skill in the art to which the invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments of the present disclosure will hereinafter be described in detail with reference to the accompanying drawings. In the drawings, like reference numerals indicate like elements, and thus, detailed descriptions thereof will be omitted.

The present disclosure relates to a transport control system and method that assign multiple jobs to each transport such as an overhead hoist transport (OHT). The transport control system can determine a particular transport as a target transport to which multiple jobs are to be assigned, based on the availability of linkage transporting and the likelihood of transport congestion and may assign multiple jobs to the target transport. Embodiments of the present disclosure will hereinafter be described in detail with reference to the accompanying drawings.

FIG. 1 is a block diagram of a transport control system according to an embodiment of the present disclosure.

Referring to FIG. 1, a transport control system 100 may include transports 110, a transport control apparatus 120, and a database 130.

Each of the transports 110 may deliver a target object to a destination. The transports 110 may be implemented as OHTs.

In a case where the transports 110 are implemented as OHTs, each of the transport 110 can transport a carrier with a wafer loaded thereon from a clean room to various facilities where processes of fabricating a semiconductor element are to be conducted. In this case, as illustrated in FIG. 2, each of the transports 110 may include a body 210, a driving controller 220, driving wheels 230, and guide wheels 240.

FIG. 2 is a front view illustrating how a transport of the transport control system of FIG. 1 is installed on a rail.

Referring to FIG. 2, the body 210 grips a carrier 250 and transports the carrier 250 to each destination (e.g., each facility where subsequent processes are to be conducted). The body 210 may be installed below the driving controller 220 and may include a gripper 211 and a lifter 212.

The gripper 211 grips the carrier 250. The gripper 211 may be moved by the lifter 212 to the direction where the carrier 250 is located and may grip the carrier 250 below the transport 110. The gripper 211 may be implemented as, for example, a hand gripper.

The lifter 212 may lift down the gripper 211 to the direction where the carrier 250 is located and may allow the gripper 211 to grip the carrier 250. Once the carrier 250 is gripped by the gripper 211, the lifter 212 may lift up the gripper 211 toward the ceiling of the clean room.

The carrier 250 may be transported to a destination while being gripped by the gripper 211 and being lifted up toward the ceiling of the clean room by the lifter 212. Once the transport 110 arrives at the destination, the lifter 212 lifts down the carrier 250 and delivers the carrier 250 to a next destination where a subsequent process is to be conducted. The lifter 212 may be implemented as, for example, a hoist.

The transport 110 may load the carrier 250 and may deliver the carrier 250 to each destination. In this case, the body 210 may include a storage (not illustrated), instead of the gripper 211.

The storage provides space in which the carrier 250 can be stored. The storage may be formed in the shape of a basket with an open top, but the present disclosure is not limited thereto. Alternatively, the storage may be formed in the shape of a cabinet with a side door.

The driving controller 220 controls the driving wheels 230, which move along rails 260. The driving controller 220 may be coupled to a pair of driving wheels 230 on both sides thereof and may be coupled to the body 210 through the bottom surface thereof. The driving controller 220 may support the body 210, which is located below the driving controller 220.

The driving controller 220 may be configured to include a driving motor (not illustrated), a driving shaft (not illustrated), and a speed adjusting unit (not illustrated).

The driving motor generates a driving force.

The driving shaft transmits the driving force generated by the driving motor to the driving wheels 230.

The speed adjusting unit adjusts the rotational speed of the driving wheels 230.

The driving controller 220 may provide a driving force to the driving wheels 230 via the driving motor and the driving shaft and may control the rotational speed of the driving wheels 230 via the speed adjusting unit.

The driving wheels 230 rotate on the rails 260 with the use of the driving force provided by the driving controller 220. To this end, at least one pair of driving wheels 230 may be installed on either side of the driving controller 220.

The guide wheels 240 are for preventing the transport 110 from being detached from the rails 260 while running on the rails 260. To this end, at least one pair of guide wheels 240 may be installed vertically on both sides of the bottom surface of the driving controller 220.

The rails 260 provide a path along which the transport 110 can move. The rails 260 may be installed on the ceiling of the clean room where a manufacturing line for fabricating a semiconductor element (e.g., a wafer) is provided.

A rail support 270 may be installed on the ceiling of the clean room along with the rails 260. A pair of rails 260 may be provided to be coupled to both sides of the rail support 270, which is fixed to the ceiling of the clean room.

The rails 260 may be formed to include sections of various shapes, such as rectilinear sections, curved sections, inclined sections, branch sections, and the like, in accordance with the layout of the clean room, but the present disclosure is not limited thereto. Alternatively, the rails 260 may be formed to include sections of a single shape (e.g., straight sections).

The rail support 270 are installed on the ceiling of the clean room to support the rails 260. The rail support 270 may be formed in the shape of a cap, for example, a U shape ("∩") or a bracket U shape ("Π").

The transport 110 may further include a cable fixer (not illustrated) and a corrector (not illustrated).

The cable fixer fixes a cable disposed below the rails 260. The cable fixer may be implemented as, for example, a Litz wire supporter.

The corrector corrects the location of the carrier 250 when the carrier 250 is being transported to each destination. The corrector may be disposed between the body 210 and the driving controller 220 to correct the location of the carrier 250.

The corrector may be configured to include a slider and a rotator. The slider moves the carrier 250 in an upward, downward, leftward, or rightward direction. The slider may be installed on the bottom surface of the driving controller 220.

The rotator rotates the carrier 250 clockwise or counterclockwise. The rotator may be installed on the bottom surface of the slider.

Referring again to FIG. 1, a plurality of transports 110 may be provided on the rails 260. Each of the transports 110 may transport a target object to each destination based on information received from the transport control apparatus 120.

The transports 110 may communicate wirelessly with the transport control apparatus 120 to receive information from the transport control apparatus 120, but the present disclosure is not limited thereto. Alternatively, the transports 110 may be connected to the transport control apparatus 120 via wires and may thus receive information from the transport control apparatus 120 via the wires.

The transport control apparatus 120 control the transports 110. The transport control apparatus 120 may be implemented as a computer equipped with a processor having a computing function.

The transport control apparatus 120 may determine a target transport to which multiple jobs are to be assigned, from among the transports 110. The transport control apparatus 120 may determine a particular transport 110 as the target transport based on the availability of linkage transporting and the likelihood of transport congestion.

Specifically, the transport control apparatus 120 may determine a particular transport 110 as the target transport based on the availability of linkage transporting. In this case, the transport control apparatus 120 may determine the particular transport 110 as the target transport based on whether the multiple jobs to be assigned are aligned in series on a single path in the traveling direction of the particular transport 110.

FIG. 3 is a schematic view illustrating an example of how the transport control apparatus of FIG. 1 determines a target transport, and FIG. 4 is a schematic view illustrating another example of how the transport control apparatus of FIG. 1 determines a target transport.

Referring to FIGS. 3 and 4, a job of transporting a first carrier from a first location 310 to a second location 320 is defined as a first job, and a job of transporting a second carrier from a third location 330 to a fourth location 340 is defined as a second job.

Referring first to FIG. 3, the first and second jobs are aligned on the same path in the traveling direction of a first transport 110a. That is, the first and second jobs can be sequentially performed in consideration of the traveling direction of the first transport 110a. In this case, the transport control apparatus 120 determines the first transport 110a as a target transport to which the first and second jobs are to be assigned.

On the contrary, referring to FIG. 4, the first and second jobs are not aligned on the same path in the traveling direction of the first transport 110a. That is, the first and second jobs cannot be sequentially performed in consideration of the traveling direction of the first transport 110a. In this case, the transport control apparatus 120 does not determine the first transport 110a as the target transport to which the first and second jobs are to be assigned.

Alternatively, the transport control apparatus 120 may determine whether the first transport 110a can perform linkage transporting based on whether there exist other transports on the moving path of the first transport 110a that is moving to perform multiple jobs. That is, the transport control apparatus 120 may determine whether the first transport 110a can perform linkage transporting in consideration of whether there exists transport congestion, and this will hereinafter be described.

FIG. 5 is a schematic view illustrating another example of how the transport control apparatus of FIG. 1 determines a target transport, and FIG. 6 is a flowchart illustrating a method of determining a target transport according to an embodiment of the present disclosure.

Referring to FIGS. 5 and 6, in S410, the transport control apparatus 120 may determine whether a second transport 110b exists on the moving path of the first transport 110a that is moving to perform the first and second jobs.

If the second transport 110b is not on the moving path of the first transport 110a, the first transport 110a can sequentially perform the first and second jobs. Thus, in S420, the transport control apparatus 120 determines the first transport 110a as a target transport to which the first and second jobs are to be assigned.

In S430, if the second transport 110b is determined to be on the moving path of the first transport 110a, the transport control apparatus 120 determines whether the second transport 110b is in an idle state.

If the second transport 110b is not in the idle state (i.e., if the second transport 110b is moving to perform another job), the first transport 110a still can sequentially perform the first and second jobs, even if the second transport 110b is on the moving path of the first transport 110a. Thus, in S420, the transport control apparatus 120 determines the first transport 110a as the target transport to which the first and second jobs are to be assigned.

If the second transport 110b is in the idle state, the first transport 110a may not be able to sequentially perform the first and second jobs because of the second transport 110b. Thus, in S440, the transport control apparatus 120 does not determine the first transport 110a as the target transport.

Alternatively, if the second transport 110b is in the idle state, the transport control apparatus 120 may move the second transport 110b, as illustrated in FIG. 7, and may allow the first transport 110a to sequentially perform the first and second jobs. FIG. 7 is a schematic view illustrating another example of how the transport control apparatus of FIG. 1 determines a target transport.

Figure 8:
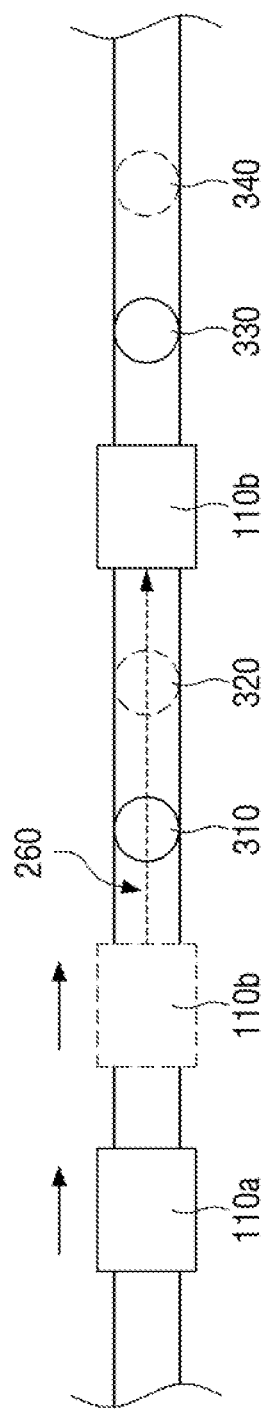
FIG. 8 is a schematic view illustrating another example of how the transport control apparatus of FIG. 1 determines a target transport.

Even if the second transport 110b is moving to perform another job, the second transport 110b may still be on the moving path of the first transport 110a, as illustrated in FIG. 8. FIG. 8 is a schematic view illustrating another example of how the transport control apparatus of FIG. 1 determines a target transport.

In this case, the transport control apparatus 120 may determine whether a location where the second transport 110b is to be after finishing its job is on the moving path of the first transport 110a.

If the location where the second transport 110b is to be after finishing its job is determined not to be on the moving path of the first transport 110a, the transport control apparatus 120 determines the first transport 110a as the target transport to which the first and second jobs are to be assigned.

On the contrary, if the location where the second transport 110b is to be after finishing its job is determined to be on the moving path of the first transport 110a, the transport control apparatus 120 does not determine the first transport 110a as the target transport to which the first and second jobs are to be assigned. In this case, the transport control apparatus 120 may move the second transport 110 and may then determine the first transport 110a as the target transport to which the first and second jobs are to be assigned.

It has been described above with reference to FIGS. 3 and 4 how to determine a particular transport 110 as a target transport to which multiple jobs are to be assigned, mainly based on the availability of linkage transporting. Also, it has been described above with reference to FIGS. 5 through 8 how to determine a particular transport 110 as the target transport, not only based mainly on the availability of linkage transporting, but also based, in part, on the likelihood of transport congestion.

However, the present disclosure is not limited to the examples of FIGS. 3 through 8. Alternatively, the transport control apparatus 120 may determine a particular transport 110 as the target transport mainly based on the likelihood of transport congestion. In this case, the transport control apparatus 120 may determine a particular transport 110 as the target transport based on whether the particular transport 110 can perform linkage transporting without causing transport congestion, and this will hereinafter be described.

FIG. 9 is a schematic view illustrating another example of how the transport control apparatus of FIG. 1 determines a target transport, and FIG. 10 is a flowchart illustrating a method of determining a target transport according to an embodiment of the present disclosure.

Referring to FIGS. 9 and 10, in S510, the transport control apparatus 120 may determine whether there is a likelihood that transport congestion will occur when the first transport 110a sequentially performs the first and second jobs. It will hereinafter be described, with reference to FIG. 11, how the transport control apparatus 120 can determine the likelihood of transport congestion caused by the first transport 110a.

FIG. 11 is a flowchart illustrating a method of determining transport congestion according to an embodiment of the present disclosure.

Referring to FIGS. 9 and 11, in S511, the transport control apparatus 120 may determine whether there exists the second transport 110b on the moving path of the first transport 110a for sequentially performing the first and second jobs.

In S512, if the second transport 110b is determined to be located on the moving path of is the first transport 110a, the transport control apparatus 120 may determine that there is a likelihood of transport congestion being caused by the first transport 110a.

On the contrary, in S513, if the second transport 110b is determined not to be located on the moving path of the first transport 110a, the transport control apparatus 120 may determine whether the second transport 110b is in an idle state.

In S514, if the second transport 110b is determined to be in an idle state, the transport control apparatus 120 may determine that there is no likelihood of transport congestion being caused by the first transport 110a because the second transport 110b is unlikely to enter the moving path of the first transport 110a.

On the contrary, in S515, if the second transport 110b is determined to be performing a particular job, the transport control apparatus 120 may determine whether a location where the second transport 110b is to be after finishing the particular job is on the moving path of the first transport 110a.

In S514, if the location where the second transport 110b is to be after finishing the particular job is determined not to be on the moving path of the first transport 110a, the transport control apparatus 120 may determine that there is no likelihood of transport congestion caused by the first transport 110a.

On the contrary, in S512, if the location where the second transport 110b is to be after finishing the particular job is determined to be on the moving path of the first transport 110a, the transport control apparatus 120 may determine that there is a likelihood of transport congestion caused by the first transport 110a.

Referring to FIGS. 9 and 10, in S520, if it is determined that there is no likelihood of transport congestion caused by the first transport 110a, the transport control apparatus 120 may determine the first transport 110a as the target transport.

On the contrary, in S530, if it is determined that there is a likelihood of transport congestion caused by the first transport 110a, the transport control apparatus 120 does not determine the first transport 110a as the target transport. Meanwhile, the transport control apparatus 120 may move the second transport 110b and may then determine the first transport 110a as the target transport.

It has been described above with reference to FIGS. 3 through 11 how to determine a target transport to which multiple jobs are to be assigned, not only based on the availability of linkage transporting, but also based on the likelihood of transport congestion.

The transport control apparatus 120 may select one of a plurality of transports 110 and may decide whether to determine the selected transport 110 as the target transport or exclude the selected transport 110.

The transport control apparatus 120 may arrange in order of closeness to the location (i.e., the first location 310) where the first job is to begin and may then select one of the plurality of transports 110. This will be described with reference to FIGS. 12 through 14.

Alternatively, the transport control apparatus 120 may randomly choose one of the plurality of transports 110.

FIG. 12 is a schematic view illustrating an example of how the transport control apparatus of FIG. 1 selects a transport, and FIG. 13 is a flowchart illustrating an example of a method of selecting a transport according to an embodiment of the present disclosure.

The embodiment of FIG. 13 will hereinafter be described, taking a transport control system 100 of FIG. 12, which includes three transports, i.e., first, second, and third transports 110a, 110b, and 110c, as an example, but the present disclosure is not limited thereto. Alternatively, the transport control system 100 may include only two transports or four or more transports.

Referring to FIG. 13, in S610, the transport control apparatus 120 determines whether the first transport 110a is in an idle state.

In S620, if the first transport 110a is determined to be in an idle state, the transport control apparatus 120 calculates the distance between the current location of the first transport 110a to a location (i.e., a first location 310) where a first job is to begin.

Thereafter, in S630, the transport control apparatus 120 calculates the distance calculated in S620 as the distance to be traveled by the first transport 110a.

On the contrary, in S620', if the first transport 110a is determined not to be in an idle state (in other words, if the first transport 110a is determined as already performing a particular job), the transport control apparatus 120 calculates the distance between a location where the first transport 110a is to be after finishing the particular job and the first location 310.

Thereafter, in S630, the transport control apparatus 120 calculates the distance calculated in S620' as the distance to be traveled by the first transport 110a.

Thereafter, the method proceeds to S640 and S650 so that the transport control apparatus 120 sequentially calculates the distance to be traveled by the second transport 110b and the distance to be traveled by the third transport 110c, in S610, S620, S620', S630, S640, and S650, in the same manner as that used to calculate the distance to be traveled by the first transport 110a.

In S660, once the distance to be traveled by the first transport 110a, the distance to be traveled by the second transport 110b, and the distance to be traveled by the third transport 110c are all calculated, the transport control apparatus 120 arranges, and gives weights to, the first, second, and third transports 110a, 110b, and 110c in increasing order of the distance to the first location 310.

For example, if the distance to the first location 310 decreases from the first transport 110a to the second transport 110b to the third transport 110c, the transport control apparatus 120 may give a greatest weight to the first transport 110a, a second greatest weight to the second transport 110b, and a smallest weight to the third transport 110c.

Thereafter, in S670, the transport control apparatus 120 chooses the first transport 110a with the greatest weight and determines whether the first transport 110a is a suitable transport to which multiple jobs can be assigned.

If the first transport 110a is determined not to be a suitable transport to which multiple jobs can be assigned, the transport control apparatus 120 may choose the second transport 110b with the second greatest weight and may determine whether the second transport 110b is a suitable transport to which multiple jobs can be assigned.

If the second transport 110b is determined not to be a suitable transport to which multiple jobs can be assigned, the transport control apparatus 120 may choose the third transport 110c with the smallest weight and may determine whether the third transport 110c is a suitable transport to which multiple jobs can be assigned.

The suitability of the first, second, and third transports 110a, 110b, and 110c may be determined based on the availability of linkage transporting and the likelihood of transport congestion. This has already been described above with reference to FIGS. 3 through 11, and thus, a detailed description thereof will be omitted.

As already mentioned above, the embodiment of FIG. 13 has been described, taking the transport control system 100 of FIG. 12, which includes three transports, i.e., the first, second, and third transports 110a, 110b, and 110c. Alternatively, the transport control system 100 may include N transports (where n is a natural number of 2 or greater), in which case, one of the N transports can be selected in a similar method to the method of FIG. 13.

The transport control apparatus 120 may select one of a plurality of transports 110 based on whether, and which of, the plurality of transports 110 are in an idle state, and this will hereinafter be described.

FIG. 14 is a flowchart illustrating a method of selecting a transport according to another embodiment of the present disclosure.

Referring to FIGS. 12 and 14, in S710, the transport control apparatus 120 determines whether the first transport 110a is an idle state.

In S720, if the first transport 110a is determined to be in an idle state, the transport control apparatus 120 detects the first transport 110a as an idle transport.

In S730, on the contrary, if the first transport 110a is determined not to be in an idle state, the transport control apparatus 120 excludes the first transport 110a from being chosen as an idle transport.

In S740 and S750, the transport control apparatus 120 may perform S710, S720, and S730 again for the second and third transports 110b and 110c and may thus detect another idle transport(s).

It is assumed that the first and second transports 110a and 110b are detected as idle transports.

In S760, the transport control apparatus 120 calculates the distance to be traveled by the first transport 110a by calculating the distance between the current location of the first transport 110a and the first location 310.

Also, in S760, the transport control apparatus 120 calculates the distance to be traveled by the second transport 110b by calculating the distance between the current location of the second transport 110b and the first location 310.

Thereafter, in S770, the transport control apparatus 120 arranges, and gives weights to, the first and second transports 110a and 110b in increasing order of the distance to the first location 310.

For example, if the first and second transports 110a and 110b can be listed in increasing order of the distance to the first location 310, the transport control apparatus 120 may give a relatively large weight to the first transport 110a and may give a relatively small weight to the second transport 110b.

Thereafter, in S780, the transport control apparatus 120 may choose the first transport 110a with the greatest weight and may determine whether the first transport 110a is a suitable transport to which multiple jobs can be assigned.

If the first transport 110a is determined not to be a suitable transport to which multiple jobs can be assigned, the transport control apparatus 120 may choose the second transport 110b with the second greatest weight and may determine whether the second transport 110b is a suitable transport to which multiple jobs can be assigned.

Referring again to FIG. 1, the database 130 may be connected to the transport control apparatus 120 in a wired or wireless manner and may provide information necessary for the transport control apparatus 120 to control the transports 110.

The database 130 may be implemented inside the transport control apparatus 120 in the form of a memory, but the present disclosure is not limited thereto. Alternatively, the database 130 may be provided in the transport control system 100 as a separate element from the transport control apparatus 120.

The database 130 may store information on whether, and which of, the transports 110 are in an idle state, current location information of idle transports 110, and information on the locations where non-idle transports are to be after finishing their jobs, but the type of information stored in the database 130 is not particularly limited.

The transport control system 100 has been described so far with reference to FIGS. 1 through 14. The transport control system 100 may be applicable to logistics automation services.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure.

What is claimed is:

1. A transport control system comprising:
   a plurality of transports, each of the plurality of transports transporting a carrier with a wafer loaded thereon; and
   a transport control apparatus controlling the plurality of transports and determining one of the plurality of transports as a target transport to which multiple jobs are to be assigned,
   wherein the transport control apparatus determines one of the plurality of transports as the target transport based on a first element, which is the availability of linkage transporting, and a second element, which is the likelihood of transport congestion, and
   wherein if the transport control apparatus determines one of the plurality of transports as the target transport based on the first element, the transport control apparatus determines the availability of linkage transporting based on whether one transport is positioned on a moving path of another transport or not, and whether the one transport can be moved or not.

2. The transport control system of claim 1, wherein if the transport control apparatus determines one of the plurality of transports as the target transport based on the first element, the transport control apparatus determines that the linkage transporting is available because the multiple jobs are aligned in series on a single path.

3. The transport control system of claim 2, wherein if the transport control apparatus determines one of the plurality of transports as the target transport based on the first element and the second element, the transport control apparatus determines a first transport, which is one of the plurality of transports that is moving to perform the multiple jobs, as the target transport based on whether there exists a second transport, which is another one of the plurality of transports, on a first moving path of the first transport.

4. The transport control system of claim 3, wherein the transport control apparatus determines the first transport as the target transport based on at least one of whether the second transport is in an idle state, whether a location where the second transport is to be after finishing its job is on the first moving path, and whether the second transport can be moved if the second transport is on the first moving path.

5. The transport control system of claim 4, wherein the transport control apparatus determines the first transport as the target transport based on whether the second transport is in an idle state, and whether a location where the second transport is to be after finishing its job is on the first moving path, and
   wherein the transport control apparatus determines the first transport as the target wherein the transport control apparatus determines the first transport as the target transport by using the former and then using the latter.

6. The transport control system of claim 1, wherein if the transport control apparatus determines one of the plurality of transports as the target transport based on the first element, the transport control apparatus determines a particular transport as the target transport by determining that the linkage transporting is available because the multiple jobs are aligned in series on a traveling path of the particular transport based on traveling paths of the plurality of transports.

7. The transport control system of claim 1, wherein if the transport control apparatus determines one of the plurality of transports as the target transport based on the second element, the transport control apparatus determines the likelihood of transport congestion based on whether there exists a second transport, which is one of the plurality of transports, on a moving path of a first transport, which is another one of the plurality of transports that is moving to perform the multiple jobs, and determines the first transport as the target transport based on the result of the determination of the likelihood of transport congestion.

8. The transport control system of claim 7, wherein the transport control apparatus determines the likelihood of transport congestion in further consideration of at least one of whether the second transport is in an idle state and whether a location where the second transport is to be after finishing its job is on the first moving path.

9. The transport control system of claim 8, wherein the transport control apparatus determines the likelihood of transport congestion in further consideration of whether the second transport is in an idle state and whether a location where the second transport is to be after finishing its job is on the first moving path, and
   wherein the transport control apparatus determines the likelihood of transport congestion by using the former and then using the latter.

10. The transport control system of claim 1, wherein if the transport control apparatus determines one of the plurality of transports as the target transport based on the first element, the transport control apparatus determines a particular transport as the target transport by determining whether the particular transport can perform the multiple jobs in series, without causing transport congestion, based on traveling paths of the plurality of transports.

11. The transport control system of claim 1, wherein the transport control apparatus gives weights to the plurality of transports by calculating a distance to be traveled, from a location where the movement of each of the plurality of transports is stopped to a starting location for performing the multiple jobs, and determines whether each of the plurality of transports is suitable as the target transport, starting from a transport that is selected first based on the weights.

12. The transport control system of claim 11, wherein the transport control apparatus determines first whether each of the plurality of transports is in an idle state and then calculates the distance to be traveled.

13. The transport control system of claim 12, wherein
for an idle transport, the transport control apparatus calculates a distance from a current location of the idle transport to the starting location for performing the multiple jobs as the distance to be traveled, and
for a non-idle transport, the transport control apparatus calculates a distance from a location where the non-idle transport is to be after finishing its job to the starting location for performing the multiple jobs as the distance to be traveled.

14. The transport control system of claim 11, wherein the transport control apparatus gives a relatively large weight to a transport having a relatively short distance to be traveled.

15. The transport control system of claim 1, wherein the transport control apparatus gives weights to the plurality of transports based on whether each of the plurality of transports is in an idle state and determines whether each of the plurality of transports is suitable as the target transport, starting from a transport that is selected first based on the weights.

16. The transport control system of claim 15, wherein if there are at least two idle transports among the plurality of transports, the transport control apparatus gives new weights to the at least two idle transports by calculating a distance to be traveled, from a location where movement of each of the at least two idle transports is stopped to a starting location for performing the multiple jobs, and determines whether each of the at least two idle transports is suitable as the target transport, starting from an idle transport that is selected first based on the new weights.

17. The transport control system of claim 16, wherein the transport control apparatus gives a relatively large weight to an idle transport having a relatively short distance to be traveled.

18. A transport control system comprising:
a plurality of transports, each of the plurality of transports transporting a carrier with a wafer loaded thereon; and
a transport control apparatus controlling the plurality of transports and determining one of the plurality of transports as a target transport to which multiple jobs are to be assigned,
wherein
the transport control apparatus determines one of the plurality of transports as the target transport based on at least one of a first element, which is the availability of linkage transporting, and a second element, which is the likelihood of transport congestion,
if the transport control apparatus determines one of the plurality of transports as the target transport based on the first element, the transport control apparatus determines a particular transport as the target transport by determining whether the multiple jobs are aligned in series on a traveling path of the particular transport based on traveling paths of the plurality of transports, and
if the transport control apparatus determines one of the plurality of transports as the if the transport control apparatus determines one of the plurality of transports as the target transport based on the second element, the transport control apparatus determines the particular transport as the target transport by determining whether the particular transport can perform the multiple jobs in series, without causing transport congestion, based on the traveling paths of the plurality of transports.

19. A transport control apparatus controlling a plurality of transports, each of the plurality of transports transporting a carrier with a wafer loaded thereon,
wherein the transport control apparatus determines one of the plurality of transports as the target transport based on a first element, which is the availability of linkage transporting, and a second element, which is the likelihood of transport congestion,
wherein if the transport control apparatus determines one of the plurality of transports as the target transport based on the first element, the transport control apparatus determines the availability of linkage transporting based on whether one transport is positioned on a moving path of another transport or not, and whether the one transport can be moved or not.

20. The transport control apparatus of claim 19, wherein
if the transport control apparatus determines one of the plurality of transports as the target transport based on the first element, the transport control apparatus determines a particular transport as the target transport by determining whether the multiple jobs are aligned in series on a traveling path of the particular transport based on traveling paths of the plurality of transports, and
if the transport control apparatus determines one of the plurality of transports as the if the transport control apparatus determines one of the plurality of transports as the target transport based on the second element, the transport control apparatus determines the particular transport as the target transport by determining whether the particular transport can perform the multiple jobs in series, without causing transport congestion, based on the traveling paths of the plurality of transports.

\* \* \* \* \*